United States Patent
Zhai

(10) Patent No.: US 11,217,575 B2
(45) Date of Patent: Jan. 4, 2022

(54) DISPLAY PANEL AND DISPLAY DEVICE HAVING REPAIR LAYERS

(71) Applicant: SHANGHAI TIANMA AM-OLED CO., LTD., Shanghai (CN)

(72) Inventor: Yingteng Zhai, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/905,981

(22) Filed: Jun. 19, 2020

(65) Prior Publication Data

US 2020/0350301 A1 Nov. 5, 2020

(30) Foreign Application Priority Data

Jan. 3, 2020 (CN) .......................... 202010006630.5

(51) Int. Cl.
| | | |
|---|---|---|
| *H01L 25/16* | (2006.01) | |
| *H01L 27/32* | (2006.01) | |
| *H01L 51/52* | (2006.01) | |

(52) U.S. Cl.
CPC .......... *H01L 25/167* (2013.01); *H01L 25/162* (2013.01); *H01L 27/3272* (2013.01); *H01L 51/5253* (2013.01); *G09G 2330/10* (2013.01); *H01L 27/323* (2013.01); *H01L 2251/5338* (2013.01); *H01L 2251/568* (2013.01)

(58) Field of Classification Search
CPC ............... H01L 25/167; H01L 27/3272; H01L 51/5253; G09G 2330/10
See application file for complete search history.

(56) References Cited

U.S. PATENT DOCUMENTS

| | | | | |
|---|---|---|---|---|
| 10,014,491 B2* | 7/2018 | Park | ................... | H01L 27/3246 |
| 10,134,904 B2* | 11/2018 | Adachi | ............... | H01L 27/1218 |
| 10,319,308 B2* | 6/2019 | Lee | ..................... | H01L 51/0097 |
| 10,381,420 B2* | 8/2019 | Liu | ........................ | G06F 3/0412 |
| 10,566,394 B2* | 2/2020 | Cai | ..................... | H01L 51/5253 |
| 10,636,863 B2* | 4/2020 | Kim | ..................... | H01L 27/3258 |
| 10,707,282 B1* | 7/2020 | Yang | ................... | H01L 51/5256 |
| 10,743,425 B2* | 8/2020 | Park | ..................... | H01L 51/5228 |
| 10,868,102 B1* | 12/2020 | Zhang | ................. | H01L 27/3262 |

(Continued)

FOREIGN PATENT DOCUMENTS

| | | |
|---|---|---|
| CN | 108766318 A | 11/2018 |
| CN | 108933161 A | 12/2018 |

*Primary Examiner* — Ida M Soward
(74) *Attorney, Agent, or Firm* — Kilpatrick Townsend & Stockton, LLP

(57) ABSTRACT

Disclosed are a display panel and a display device. The display panel includes: a substrate and a pixel array, where the pixel array is located on a side of the substrate, and the pixel array includes at least one inorganic insulating layer, and an edge of the inorganic insulating layer are located in the non-display area; a first repair layer, where the first repair layer is located in the non-display area, the first repair layer is located on a side of the inorganic insulating layer facing away from the substrate, the first repair layer covers the edge of the inorganic insulating layer, the first repair layer is in contact with the substrate, and the first repair layer has a repair function; and a light source, where the light source is located in the non-display area and configured to provide light to the first repair layer to trigger the repair function.

16 Claims, 11 Drawing Sheets

(56) References Cited

U.S. PATENT DOCUMENTS

| | | | | |
|---|---|---|---|---|
| 2012/0211874 | A1* | 8/2012 | Yamazaki | H01L 51/0021 |
| | | | | 257/632 |
| 2016/0111053 | A1* | 4/2016 | Yamazaki | G09G 3/3225 |
| | | | | 345/205 |
| 2017/0288004 | A1* | 10/2017 | Kim | H01L 27/3276 |
| 2018/0159077 | A1* | 6/2018 | Lee | H01L 27/3244 |
| 2020/0006702 | A1* | 1/2020 | Sonoda | G09F 9/30 |
| 2020/0067017 | A1* | 2/2020 | Seo | H01L 51/0096 |
| 2020/0083314 | A1* | 3/2020 | Choi | H01L 27/3262 |
| 2020/0135835 | A1* | 4/2020 | Seo | H01L 27/3276 |
| 2020/0136087 | A1* | 4/2020 | Kim | H01L 27/3225 |
| 2020/0161397 | A1* | 5/2020 | Pang | H01L 27/3248 |
| 2020/0212354 | A1* | 7/2020 | Zhang | H01L 51/5253 |
| 2021/0035957 | A1* | 2/2021 | Tseng | H01L 23/13 |
| 2021/0098525 | A1* | 4/2021 | Bang | H01L 27/323 |
| 2021/0104555 | A1* | 4/2021 | Kwak | H01L 51/56 |

* cited by examiner

DISPLAY PANEL AND DISPLAY DEVICE HAVING REPAIR LAYERS

CROSS-REFERENCE TO RELATED APPLICATIONS

This application claims priority to Chinese patent application No. CN 202010006630.5 filed with CNIPA on Jan. 3, 2020, the content of which is incorporated herein by reference in its entirety.

FIELD

The present disclosure relates to the field of display techniques, and particularly, relates to a display panel and a display device.

BACKGROUND

An organic light-emitting diode (OLED) display, also known as an organic electroluminescence display, is a new type of flat-panel display device. The OLED display has a broad application prospect for its advantages such as simple preparation process, low cost, low power consumption, high light-emitting brightness, wide range of working temperature adaptability, light weight, fast response speed, easy to achieve color display and large screen display, easy to match with integrated circuit driver, and easy to achieve flexible display.

According to driving manners, OLEDs may be divided into two major types of passive matrix OLED (PMOLED) and active matrix OLED (AMOLED), i.e., two types of direct addressing and thin film transistor (TFT) matrix addressing. AMOLED has pixels arranged in an array and belongs to the active display type. It has high light-emitting efficacy and is usually used as a large high-resolution display device.

Common mobile terminal display devices include mobile phones, tablet computers, etc. When used by a user, a mobile terminal is often dropped or impacted accidentally, which causes micro-cracks on the display panel. At the same time, since flexible displays have characteristics of being bendable and having good flexibility, they have developed rapidly in the display field. Flexible display devices are often stretched and bent during use, which also causes micro-cracks on flexible display panels. Both the flexible display panel and the non-flexible display are prone to micro-cracks. Slight micro-cracks will affect the display effect, such as the appearance of stains, dark spots and color shifts; while severe micro-cracks will cause the display panel to work abnormally, therefore the user experience is affected.

As such, the repair cost of the display panel of the mobile terminal display device is high, the possibility of having cracks again is high, and the stability of the display panel is relatively low. In this case, it is necessary for the display panel itself to have a complete system for repairing cracks.

SUMMARY

In view of this, the present disclosure provides a display panel and a display device, and the display panel and the display device.

The present disclosure provides a display panel, and the display panel includes: a display area and a non-display area surrounding the display area; a substrate; a pixel array, where the pixel array is located at a side of the substrate, the pixel array comprises at least one inorganic insulating layer, and an edge of the inorganic insulating layer is located in the non-display area; a first repair layer, where the first repair layer is located in the non-display area, the first repair layer is located on a side of the inorganic insulating layer facing away from the substrate, the first repair layer covers the edge of the inorganic insulating layer, the first repair layer is in contact with the substrate, and the first repair layer has a repair function; and a light source, where the light source is located in the non-display area and configured to provide light to the first repair layer to trigger the repair function.

Based on the same inventive concept, in a second embodiment, the present disclosure further provides a display device, including any one of the display panels provided by the present disclosure.

Compared with the related art, the display panel and the display device provided by the present disclosure achieve at least the following beneficial effects.

The display panel provided by the present disclosure includes a display area and a non-display area surrounding the display area; a substrate and a pixel array, where the pixel array is located on a side of the substrate, the pixel array includes at least one inorganic insulating layer and an edge of the inorganic insulating layer is located in the non-display area; a first repair layer, where the first repair layer is located in the non-display area, the first repair layer is located on a side of the inorganic insulating layer facing away from the substrate, the first repair layer covers the edge of the inorganic insulating layer, the first repair layer is in contact with the substrate, and the first repair layer has a repair function. When the display panel is accidentally dropped, accidentally collided, mechanically stretched or mechanically folded, the film layer in the display panel is prone to stress and cracks, and especially at the edge of the inorganic layer of the display panel, due to the poor flexibility, high hardness and high risk of film peeling of the inorganic layer, the risk of film peeling is higher, and cracks are more likely to occur. In one embodiment, a first repair layer is provided on the edge of the inorganic layer, and the first repair layer has a repair function. When a crack occurs on the edge of the inorganic insulating layer of the display panel, the first repair layer can quickly fill the crack gap, which avoids the situation that the expansion of the crack to the display area causes poor display of the display panel and thus requires replacement of components, and the service life of the display panel is increased. In another embodiment, the first repair material is more viscous than the inorganic insulating layer, the first inorganic layer after filling the crack gap can better fix the inorganic insulating layer, increase the adhesion between the inorganic insulating layers, and the inorganic insulating layers are better bonded, so the probability of new cracks becomes smaller and the stability of the display panel is improved. Further, the display panel provided by the present disclosure further includes a light source. The light source is located in the non-display area and is used to provide light to the first repair layer to trigger the repair function. The light source provides light to the first repair layer and is used to autonomously trigger the activation of the first repair layer to carry out the repair process of cracks. Compared with the related art, in one embodiment, the light provided by the present disclosure actively initiates the repair process of the first repair layer, which does not require external stimulation or heating system to initiate the repair process, and reduces the impact of external stimulation and heating systems on the display panel; in another embodiment, the repair process of the display panel can be started at any time by adjusting the

DETAILED DESCRIPTION

Figure 1:
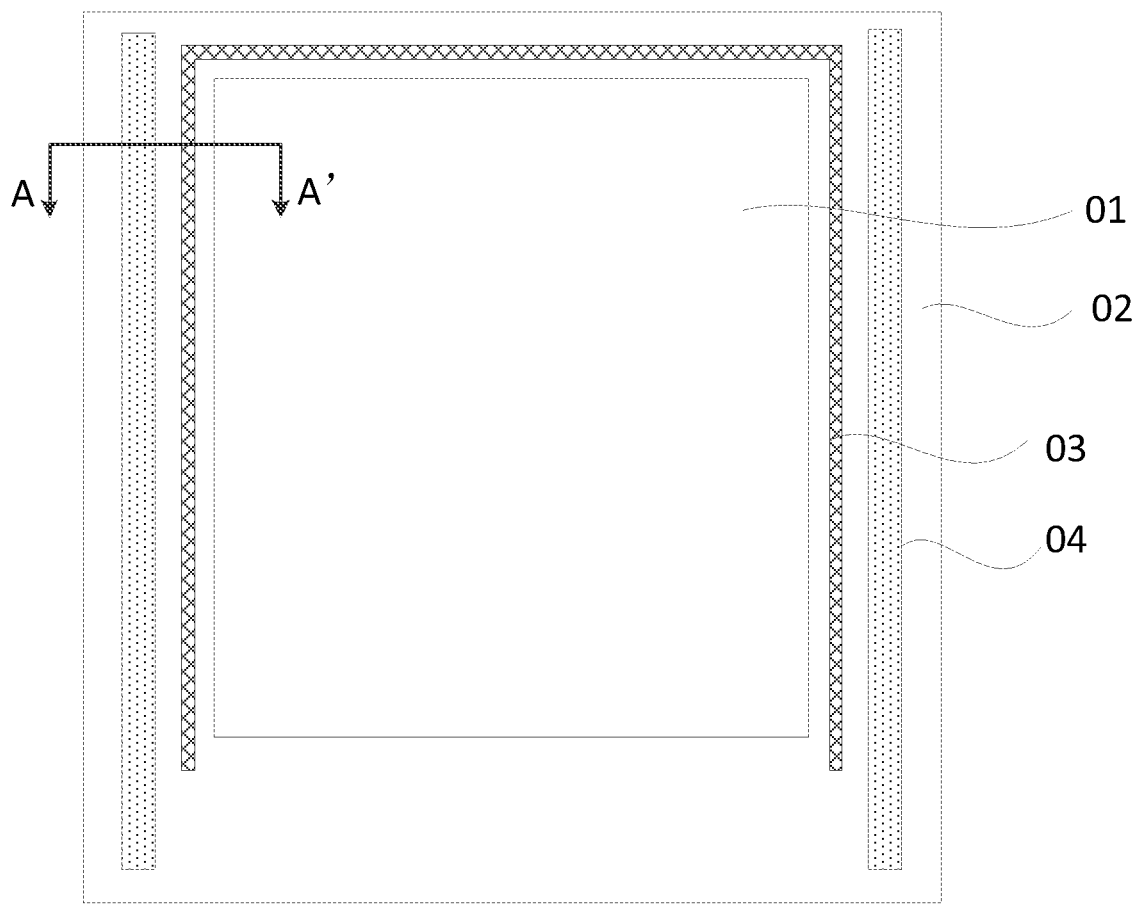
FIG. 1 is a schematic diagram of an implementation mode of a display panel according to an embodiment of the present disclosure.

Various exemplary embodiments of the present disclosure will now be described in detail with reference to the drawings. It should be noted that, unless specifically stated, otherwise the relative arrangement of components and steps, numerical expressions, and numerical values set forth in these embodiments do not limit the scope of the present disclosure.

The following description of at least one exemplary embodiment is actually merely illustrative and is in no way intended to limit the disclosure and its application or uses.

It should be noted that similar reference numerals and letters indicate similar items in the following drawings, so once an item is defined in one drawing, it need not be discussed further in subsequent drawings.

Figure 2:
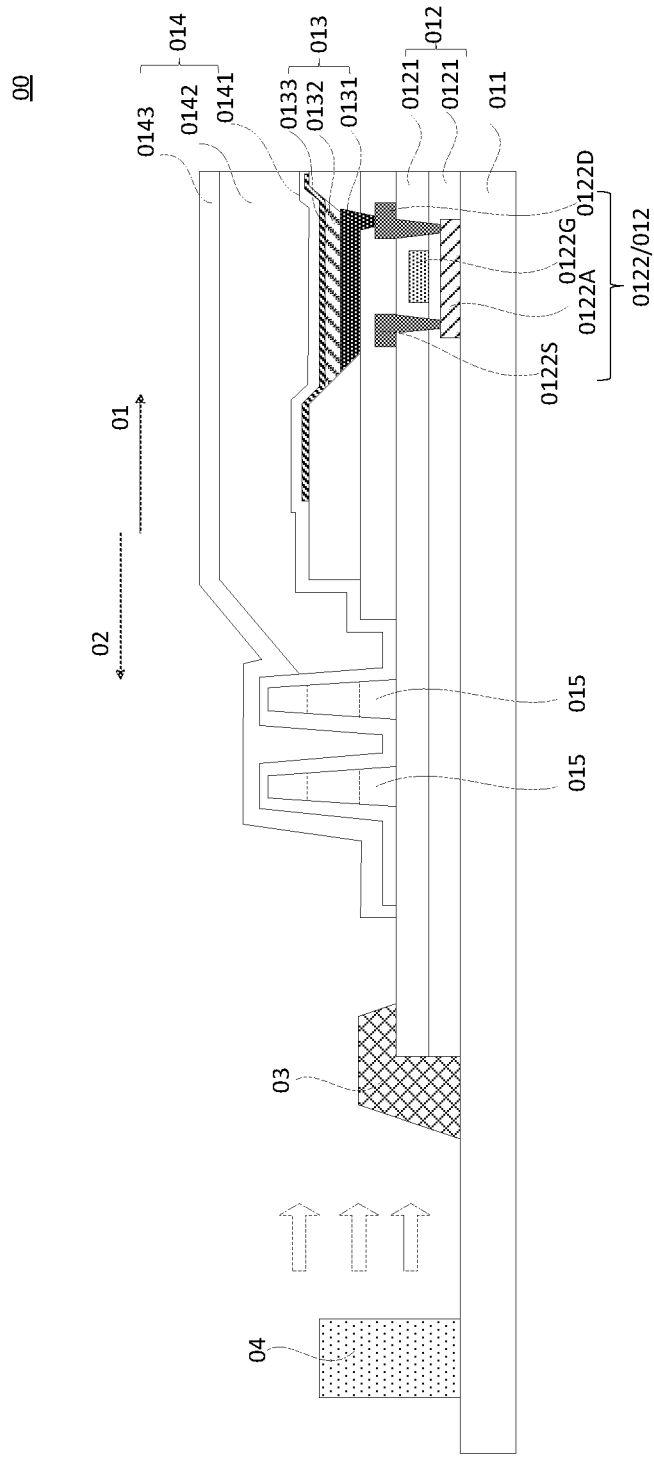
FIG. 2 is a schematic cross-sectional view of the display panel shown in FIG. 1 at AA'.

FIG. 1 is a schematic diagram of an implementation mode of a display panel according to an embodiment of the present disclosure. FIG. 2 is a schematic cross-sectional view of the display panel shown in FIG. 1 at AA'. With reference to FIG. 1 and FIG. 2, the display panel includes a display area 01 and a non-display area 02 surrounding the display area 01, the display panel 00 includes a substrate 011 and a pixel array, the pixel array being located on a side of the substrate 011; the pixel array may include multiple thin film transistors 0122, each thin film transistor 0122 includes a source 0122S, a drain 0122D, a gate 0122G, an active layer 0122A, and multiple inorganic insulating layers 0121, that is, the pixel array includes at least one inorganic insulating layer 0121. An edge of the inorganic insulating layer 0121 is located in the non-display area 02; and it can be understood that the edge of the inorganic insulating layer 021 is located in the non-display area 02, that is, the cut-off position of the inorganic insulating layer 0121 is located in the non-display area 02.

With continued reference to FIG. 1 and FIG. 2, the display panel 00 further includes a first repair layer 03. The first repair layer is located in the non-display area 02. The first repair layer 03 is located on a side of the inorganic insulating layer 0121 facing away from the substrate 011, and the first repair layer 03 covers the edge of the inorganic insulating layer 0121. Since the inorganic layer has poor flexibility, high hardness, a higher risk of film peeling, cracks are more likely to occur, and water and oxygen intrusion into the display panel starts from the edge of the display panel, the edge of the inorganic layer insulating layer 0121 of the display panel 00 is covered with a first repair layer 03; the first repair layer 03 is in contact with the substrate 011, and the first repair layer 03 has a repair function; it can be understood that the repair function responds to cracks and repairing and perfecting the cracks. During the long-term use, part of film layers of the display panel, which suffers force or impact repeatedly, will gradually generate micro-cracks. Over time, the micro-cracks will gradually extend and eventually affect the performance of the display panel. When cracks occur on the edges of the inorganic insulating layer of the display panel, the first repair layer can quickly fill the crack gaps, the condition that the display panel is poor in display and needs to be replaced due to the fact that the cracks can expand towards the display area is avoided, self-repairing capability of the display panel is improved, and therefore the service life of the display panel is prolonged. In another embodiment, the first repair layer 03 is in contact with the substrate 011. The first repair layer 03 covers an edge of the inorganic insulating layer 0121 and at least part of the first repair layer 03 is in contact with the substrate 011. The first repair layer 03 is arranged and the edge of the insulating layer 0121 is completely enclosed in the first repair layer 03, and the possibility of the intrusion of water, oxygen and crack is completely avoided.

With continued reference to FIG. 1 and FIG. 2, the display panel further includes a light source 04. The light source 04 is located in the non-display area 02 and is used to provide light to the first repair layer 03 to induce repair function. The light source 04 provides light to the first repair layer 03 and is used to autonomously trigger the activation of the first repair layer to carry out the repair process of cracks. In one embodiment, the light provided by the present disclosure actively initiates the repair process of the first repair layer, which does not require external stimulation or heating system to initiate the repair process, and reduces the impact of external stimulation and heating systems on the display panel; in another embodiment, the repair process of the display panel can be started at any time by adjusting the lighting time of the light source, and the defects of the display panel can be repaired at any time, which extends the life of the display panel.

Furthermore, the first repair layer is a polymer organic material, and the first repair material is more viscous than the inorganic insulating layer. The first repair material is more viscous than the inorganic insulating layer, the first inorganic layer after filling the crack gap can better fix the inorganic insulating layer, increase the adhesion between the inorganic insulating layers, and the inorganic insulating layers are better bonded, so the probability of new cracks becomes smaller.

Further, the first repair layer belongs to a chemical repair, so the repair material layer is a consumable. In the present disclosure, the light source is used to provide regular inspection and repair for the display panel, which not only improves the life of the display panel but also extends the life of the first repair layer.

In an embodiment, an organic light-emitting layer 013 includes multiple light-emitting devices, and each light-emitting device includes an anode 0131, a light-emitting functional layer 0132, and a cathode 0133. In an embodiment, the display panel further includes an encapsulation structure 014. The encapsulation structure 014 is located on a side of the organic light-emitting layer 013 facing away from the substrate 011. The encapsulation structure 014 surrounds and covers the organic light-emitting layer 013. The encapsulation structure 014 isolates water and oxygen, protects the organic light-emitting layer 013 and ensures the service life of the display panel. The encapsulation structure may be a thin film encapsulation layer, and the thin film encapsulation layer includes at least one organic encapsulation layer and at least one inorganic encapsulation layer. Due to the high density of the inorganic material, the inorganic encapsulation layer can play a good role in blocking water and oxygen. Because of the good flexibility of the organic material, the organic encapsulation layer can help release the stress experienced by the inorganic encapsulation layer and reduce the risk of cracks in the inorganic encapsulation layer. The stacking arrangement of the organic encapsulation layer and the inorganic encapsulation layer can ensure the effectiveness of the overall encapsulation and improve the bending resistance of the entire display panel. As shown in FIG. 2, the encapsulation structure 014 includes a first inorganic encapsulation layer 0141, an organic encapsulation layer 0142 and a second inorganic encapsulation layer 0143; and the encapsulation structure may also be a rigid encapsulation.

In an embodiment, as shown in FIG. 2, the encapsulation structure 014 includes a first inorganic encapsulation layer 0141, an organic encapsulation layer 0142 and a second inorganic encapsulation layer 0143. The display panel 00 further includes at least one blocking wall 015. Two blocking walls 015 are shown, but the present disclosure is not limited to this; the blocking wall 015 may block the flow of the organic encapsulation layer 0142 in the thin film encapsulation structure 014, and reduce the size of the non-display area to achieve a narrow frame; in addition, the blocking wall may prevent water and oxygen from invading the display area and protect the display panel. The display panel 00 may further include a planarization layer, a pixel definition layer, and a support layer, where the blocking wall 015 is prepared of the same layer and the same material as at least one of the planarization layer, the pixel definition layer, and the support layer. The preparation of the barrier wall 015 does not require an additional preparation process, which saves production costs.

The display panel provided by the present disclosure includes a display area and a non-display area surrounding the display area; a substrate and a pixel array, where the pixel array is located on a side of the substrate, the pixel array includes at least one inorganic insulating layer and an edge of the inorganic insulating layer is located in the non-display area; a first repair layer, where the first repair layer is located in the non-display area, the first repair layer is located on a side of the inorganic insulating layer facing away from the substrate, the first repair layer covers the edge of the inorganic insulating layer, the first repair layer is in contact with the substrate, and the first repair layer has a repair function. When the display panel is accidentally dropped, accidentally collided, mechanically stretched, and mechanically folded, the film layer in the display panel is prone to stress and cracks, and especially at the edge of the inorganic layer of the display panel, due to the poor flexibility and hardness of the inorganic layer, the risk of film peeling is higher, and cracks are more likely to occur. In one embodiment, a first repair layer is provided on the edge of the inorganic layer, and the first repair layer has a repair function. When a crack occurs on the edge of the inorganic insulating layer of the display panel, the first repair layer can quickly fill the crack gaps, which avoid the situation that the expansion of the cracks to the display area to cause display poorly of the display panel and requiring the replacement of components, and the service life of the display panel is improved; in another embodiment, the first repair material is more viscous than the inorganic insulating layer, the first inorganic layer after filling the crack gap can better fix the inorganic insulating layer, increase the adhesion between the inorganic insulating layers, and the inorganic insulating layers are better bonded, so the probability of new cracks becomes smaller and the stability of the display panel is improved. Further, the display panel provided by the present disclosure further includes a light source. The light source is located in the non-display area and is used to provide light to the first repair layer to induce repair function. The light source provides light to the first repair layer and is used to autonomously trigger the activation of the first repair layer to carry out the repair process of cracks. Compared with the related art, in one embodiment, the light provided by the present disclosure actively initiates the repair process of the first repair layer, which does not require external stimulation or heating system to initiate the repair process, and reduces the impact of external stimulation and heating systems on the display panel; in another embodiment, the repair process of the display panel can be started at any time by adjusting the lighting time of the light source, and the defects of the display panel can be repaired at any time, which extends the life of the display panel.

In an embodiment, the first repair layer includes a base material and an initiator. In an embodiment, the initiator includes a photoacid generator, and the base material comprises an acrylic monomer. A photoacid generator is a light-sensitive compound that decomposes under light to produce acids (H+). During a baking process after exposure, these acids act as catalysts to shed acid-labile groups suspended on the polymer and generate new acids. In an embodiment of the present disclosure, the light source 04 is used to provide light for the first repair layer 03. The initiator in the first repair layer 03 generates a chemical reaction under the condition of light, so that the photoacid generator is decomposed under the effect of light and the base material begins the polymerization reaction process. This polymerization reaction process can repair the micro-cracks on the surface of the film layer and avoid the expansion and extension of the cracks.

In an embodiment, the acrylic monomer may include methyl (meth) acrylate, ethyl (meth) acrylate, n-propyl (meth) acrylate, isopropyl (meth) acrylate, and n-butyl (meth) acrylate Ester, isobutyl (meth) acrylate, sec-butyl (meth) acrylate, tert-butyl (meth) acrylate, n-amyl (meth) acrylate, isoamyl (meth) acrylate, (meth)) N-hexyl acrylate, 2-methylpentyl (meth) acrylate, n-octyl (meth) acrylate, 2-ethylhexyl (meth) acrylate, n-decyl (meth) acrylate, (methyl) N-dodecyl acrylate, n-octadecyl (meth) acrylate, isobornyl (meth) acrylate, cyclohexyl (meth) acrylate, phenyl (meth) acrylate, and (meth) acrylic acid Benzyl ester.

In an embodiment, the light source is selective light-emitting. It can be understood that the selectivity refers to selective treatment, and specifically and selective light-emitting means that light-emitting time of the light source is controllable and selectable. The specific time selection may be limited according to the actual needs of the display panel.

In an embodiment, the light source is active and selective light-emitting, and the light source has a fixed light-emitting frequency. It can be understood that the active and selective light-emitting is that the light source is set to start spontaneously, and the light source is capable of starting start lighting spontaneously without external collision or external stimulation. The lighting frequency of a specific light source may be set according to actual needs. The average life of a display device is 5 years. If the light source illuminates since it is turned on, the life of the first repair layer will be greatly reduced, and in the follow-up, for example, in the fourth year, the display panel is exposed to external stimuli or accidentally dropped, at this time, the repair ability of the first repair layer is weakened, which will affect the repair effect. In an embodiment, the light-emitting frequency of the light source is therefore once a week, the illumination time is 1 minute each time, the light source is turned on at a fixed time every week, the light source is turned on regularly to ensure that the initiator of the first repair layer receives the light, and the polymerization reaction between the substrate material and the initiator is initiated to realize crack repair.

In an embodiment, the light source has a fixed light-emitting frequency. The light-emitting frequency of the light source may be set when the display panel is designed in the factory. At the same time, the light-emitting frequency of the light source is adjustable. During use, a user may adjust the light-emitting frequency of the light source according to the system settings in the display panel. In one embodiment, the user has a high frequency of accidental drops or collisions during use, at this time, the light-emitting frequency needs to be shortened, for example, the light source emits light twice a week, and the display panel is repaired twice a week. The light-emitting frequency of the light source is adjustable, and according to the frequency of the user's own use of the display panel and the probability of collision of the user's display panel, a more humanized setting of the light-emitting frequency of the light source increases the life of the display panel and the user experience.

In an embodiment, the light source is both passive and selective light-emitting, and the light source is configured to emit light after the display panel is subject to an external stimuli. It can be understood that the passive and selective light-emitting is to activate the light source to emit light when the display panel is subject to an external stimuli. The external environment of the display panel changes. In one embodiment, when the display panel enters a low temperature environment from a high temperature environment, due to the sudden change in temperature, the thermal expansion and contraction phenomenon causes the display panel film to crack easily, or when the display panel is subject to external stimuli, such as the display panel falling or bumping, it is easy to cause cracks to cause invasion of water and oxygen. In the case that the external appearance may cause cracks in the display panel, the light source of the display panel is passively triggered to emit the light of the first repair layer, and the automatic repair capability of the display panel is started.

In an embodiment, the light source is not only active and selective light-emitting but passive and selective light-emitting. When the display panel senses no external stimuli, the light source actively and selectively emits light, and the display panel is regularly repaired; when the display panel senses external changes or stimuli, the light source passively and selectively emits light, in some instances, automatic light-emitting is started, and the first repair layer is used to repair the display panel. Two trigger mechanisms are used to start the light source to emit light, that is, the first repair layer performs a repair function, repairs the display panel in all directions, and prolongs the life of the display panel.

Figure 3:
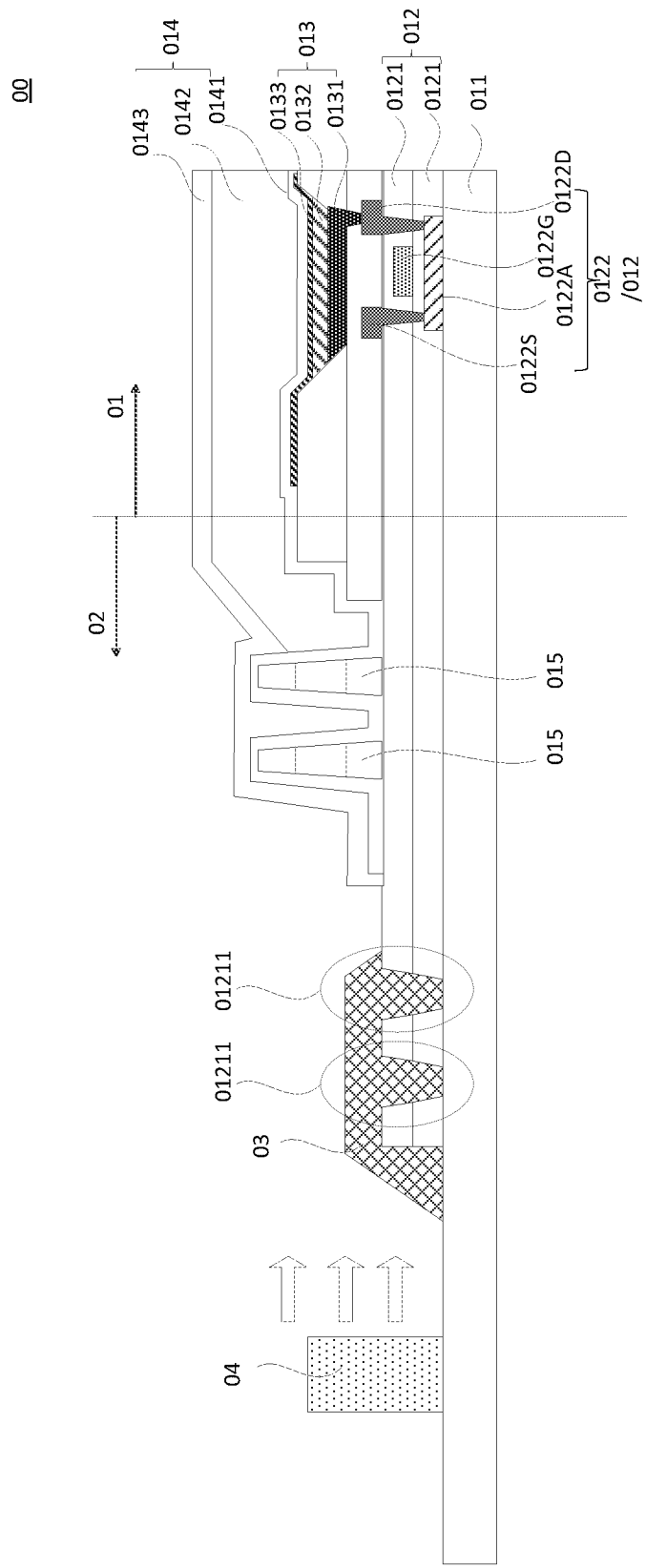
FIG. 3 is a schematic diagram of another embodiment of the display panel shown in FIG. 1 at AA'.

In an embodiment, the inorganic insulating layer has at least one groove, and the groove is located in the non-display area; the groove is filled with the first repair layer. FIG. 3 is a schematic diagram of another embodiment of the display panel shown in FIG. 1 at AA'. As shown in FIG. 3, the inorganic insulating layer 0121 includes at least one groove 01211. The groove 01211 is located in the non-display area 02. The groove 01211 is filled with the first repair layer 03. The groove 01211 is located on a side of the blocking wall 015 facing away from the display area 01. The pixel array 012 includes multiple inorganic insulating layers 0121, and at least one groove 01211 is formed on the inorganic insulating layer 0121. A crack is generated on the edge of the display panel, and the crack easily enters the display area of the display panel along the inorganic insulating layer. The groove 01211 can effectively cut off the path of the crack and prevent water and oxygen from invading. Further, the groove 01211 is filled with the first repair layer 03, and the first repair layer 03 is a polymer organic material, which has a large adhesion and can increase the contact ability between the inorganic insulating layer 0121 and the substrate 011, which has better effect of preventing crack invasion. In another embodiment, using the groove 01211 increases the contact area between the first repair layer 03 and the inorganic insulating layer 0121, and the repair area of the first repair layer 03 to the inorganic insulating layer 0121 is increased, which can repair the micro-cracks on the surface of the inorganic insulating layer to the maximum extent.

In an embodiment, multiple grooves 01211 may be provided. Only two grooves 01211 are shown in FIG. 3, but the present disclosure is not limited thereto. The depth of the grooves 01211 may be different or the same, which may be limited according to the actual process, which will not be described in detail in the present disclosure.

Figure 4:
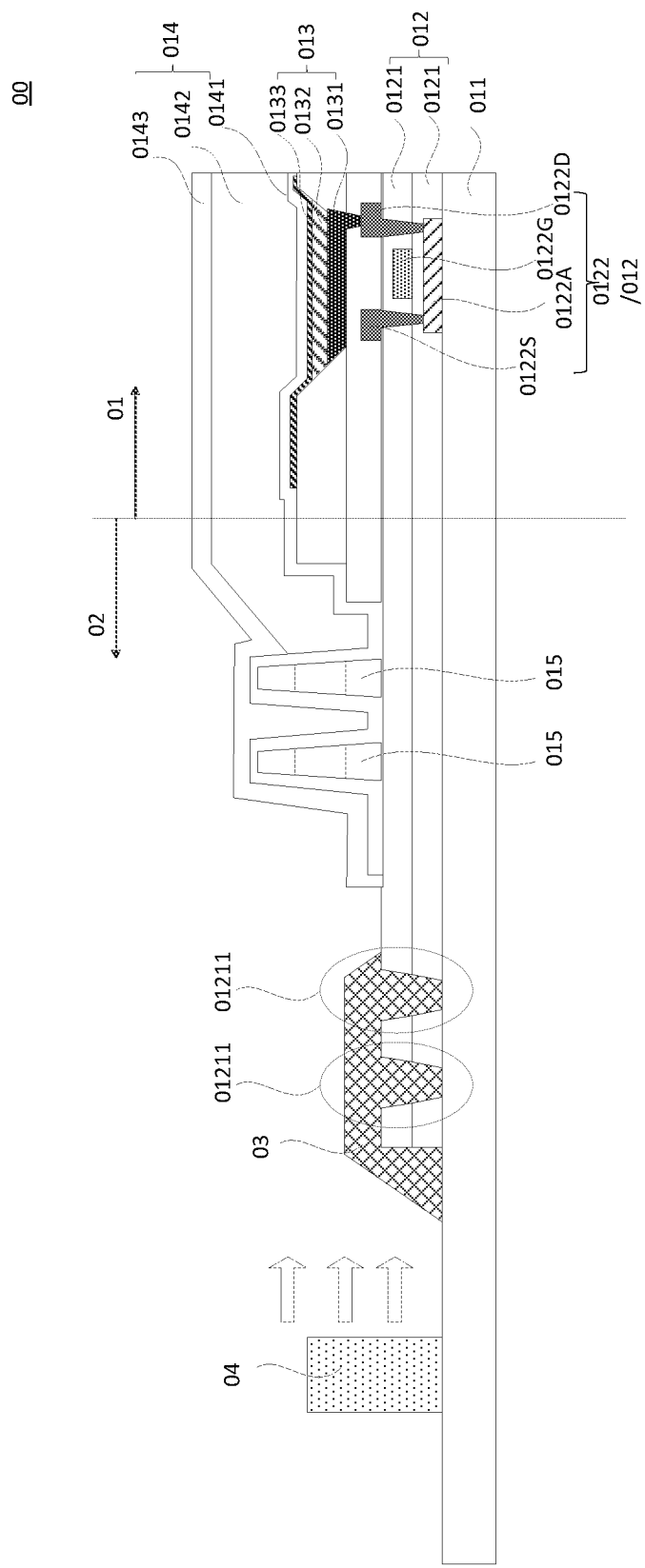
FIG. 4 is a schematic diagram of another embodiment of the display panel shown in FIG. 1 at AA'.

In an embodiment, the light source is located on a side of the substrate facing away from the light-exiting surface. FIG. 4 is a schematic diagram of another embodiment of the display panel shown in FIG. 1 at AA'. As shown in FIG. 4, the light source 04 is located on a side of the substrate 011 facing away from the light-exiting surface and on the back of the display panel. In an embodiment, the light source is an external light source. This light source may be used as a display device flashlight. When the display device activates the flashlight function, the light source is naturally triggered to activate the light naturally, and the first repair layer performs the repair function to repair the display panel. At the same time, the light source is located on the side of the base substrate facing away from the light-exiting surface, which is convenient to prepare, and efficiency of receiving light of the first repair layer is high and power consumption is saved.

In an embodiment, the display panel further includes a light-shielding layer, the light-shielding layer is located on a side of the pixel array facing away from the substrate, and the light-shielding layer is located in the non-display area.

Figure 5:
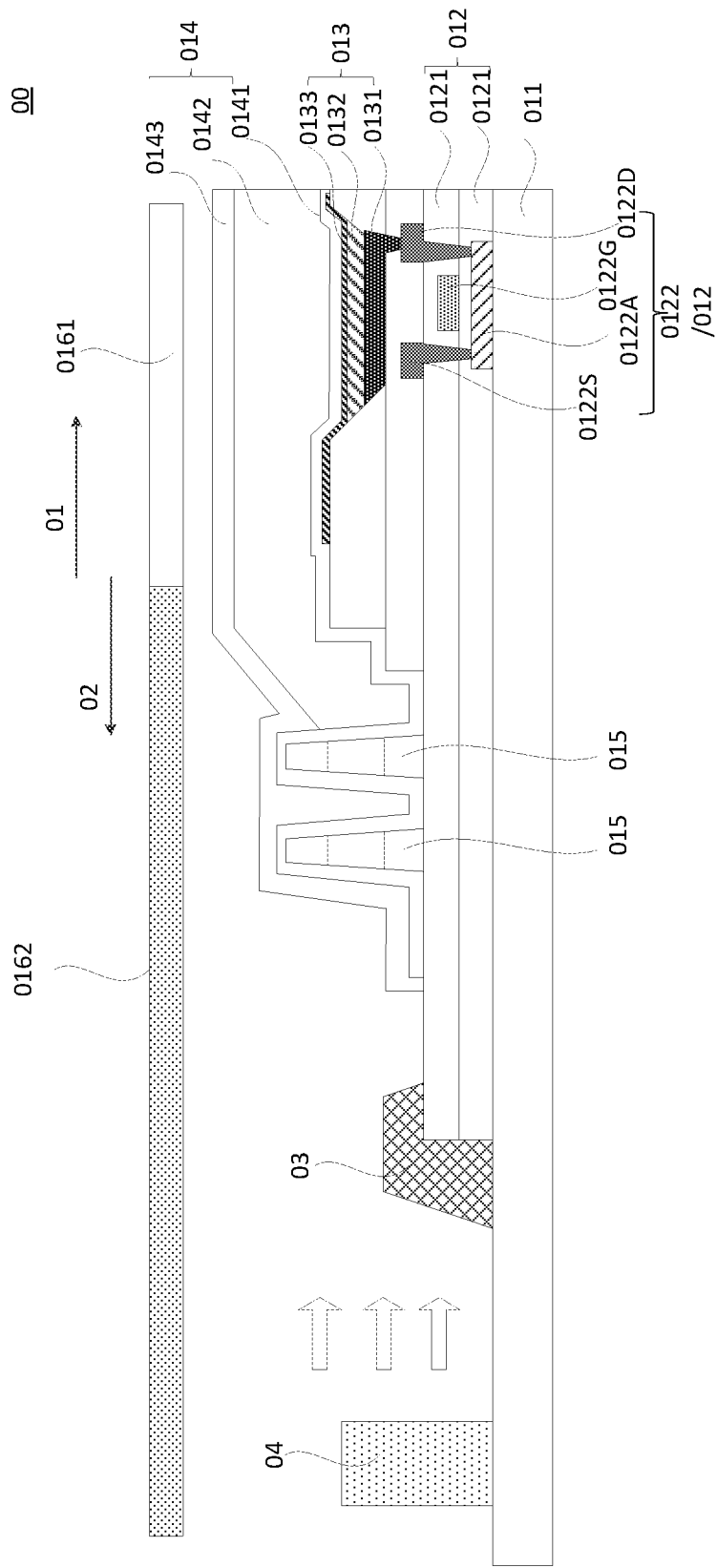
FIG. 5 is a schematic diagram of another embodiment of the display panel shown in FIG. 1 at AA'.

FIG. 5 is a schematic diagram of another embodiment of the display panel shown in FIG. 1 at AA'. The display panel 00 further includes a light-shielding layer 0162. The light-shielding layer 0162 is located on a side of the pixel array 012 facing away from the substrate 011. That is, the light-shielding layer is located on the light-exiting side of the display panel 00. The light-shielding layer 0162 is located in the non-display area 02. The light-shielding layer 0162 is provided in the light-exiting layer of the display panel in the non-display area 02, and is used to block light emitted by the light source from leaking in the non-display area. The light leakage affects the normal display of the entire display panel display area. The use of the light-shielding layer can not only solve the light leakage caused by the light source in this embodiment, but also address illumination of the non-display area brought by the display area of the display panel itself. In an embodiment, the display panel may further include a glass cover, and the light-shielding layer is located on a side of the glass cover facing the substrate; continuing to refer to FIG. 5, the display panel further includes a light-transmissive layer 0161, and the light-transmissive layer 0161 is located on a side of the encapsulation structure of the display area facing away from the substrate. The light-transmissive layer 0161 has a high light transmittance, does not affect the normal light-exiting of the display panel, and can be used to protect the display panel.

Figure 6:
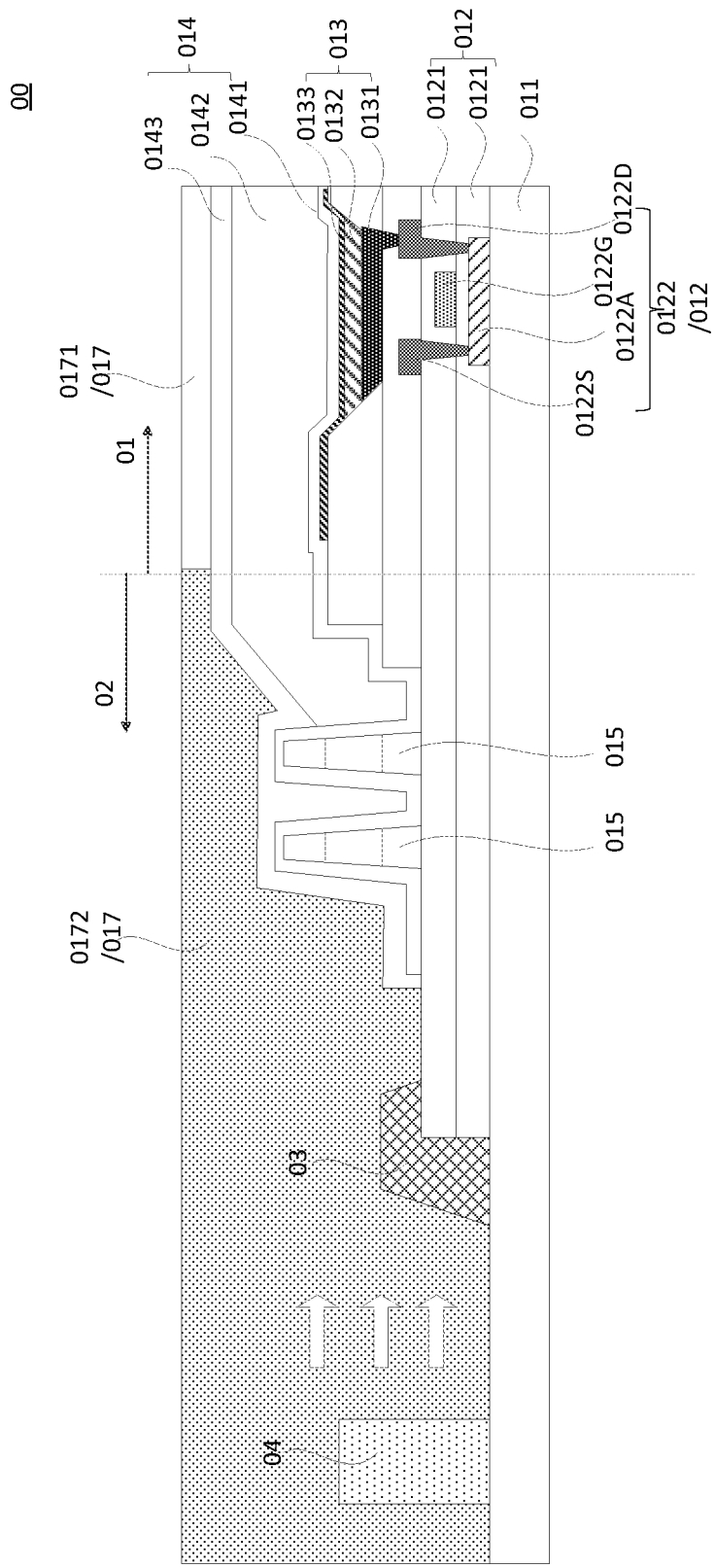
FIG. 6 is a schematic diagram of another embodiment of the display panel shown in FIG. 1 at AA'.

FIG. 6 is a schematic diagram of another embodiment of the display panel shown in FIG. 1 at AA'. As shown in FIG. 6, the display panel also includes an optical adhesive material 017. The optical adhesive material 0172/017 located in the non-display area 02 is filled with light absorbing particles, and the optical adhesive material 0171/017 located in the display area 01 has no light absorbing particles.

The plastic material 017 absorbs the light emitted from the light source 04 in the display panel 00, and no additional light-shielding layer components are required to block the non-display area to avoid light leakage in the non-display area 02.

In an embodiment, the display panel further includes an organic light-emitting layer. The organic light-emitting layer is located on a side of the pixel array facing away from the substrate. The light source is an organic light-emitting diode, and the organic light-emitting diode and the light-emitting device are prepared in a same layer.

Figure 7:
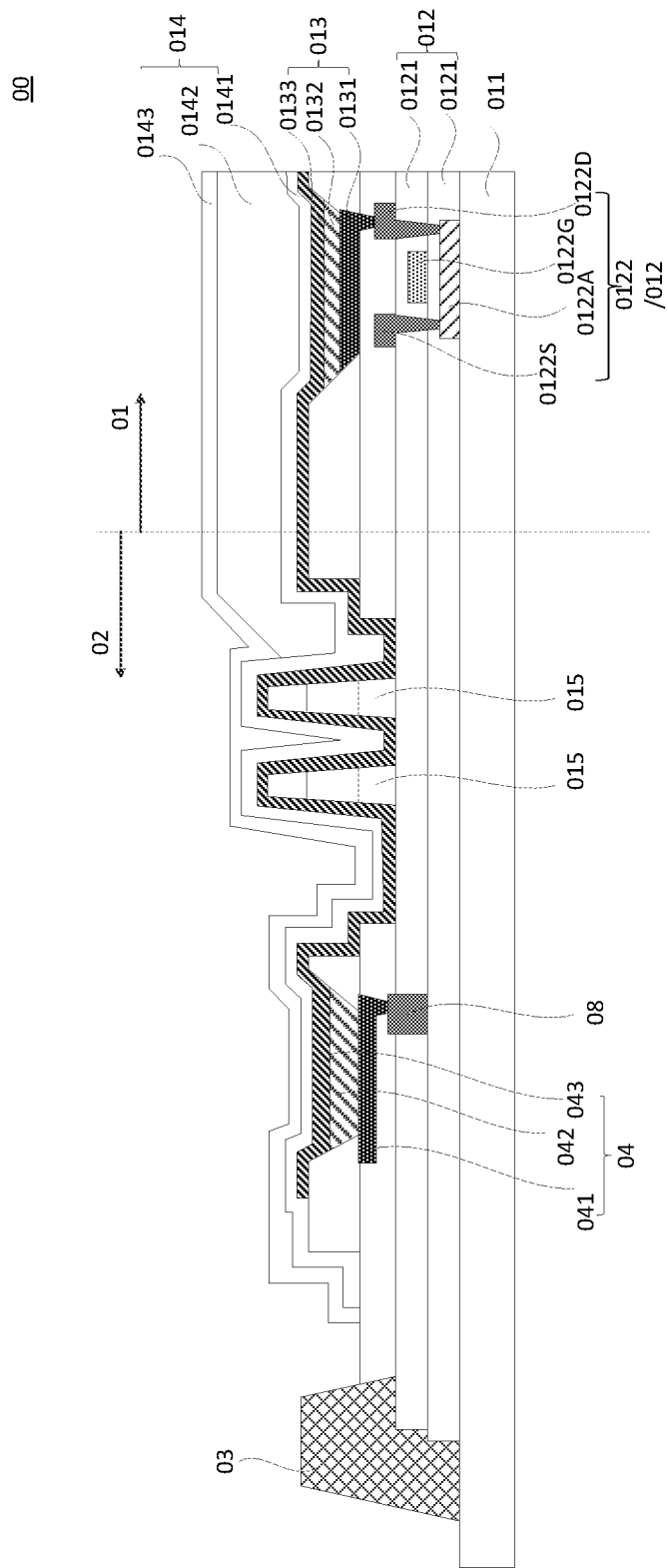
FIG. 7 is a schematic diagram of another embodiment of the display panel shown in FIG. 1 at AA'.

FIG. 7 is a schematic diagram of another embodiment of the display panel shown in FIG. 1 at AA'. As shown in FIG. 7, the display panel includes an organic light-emitting layer 013, which is located on a side of the pixel array 012 facing away from the substrate 011. The organic light-emitting layer 013 of the display area 01 includes multiple light-emitting devices. The light source 04 is an organic light-emitting diode 04 (organic light-emitting diodes are used as the light source, so the same labeling is used for both), organic light-emitting diodes 04 and light-emitting devices are prepared in a same layer. In one embodiment, the organic light-emitting diode 04 includes a first electrode 041, a functional layer 042, and a second electrode 043. The light-emitting device includes an anode 0131, a light-emitting functional layer 0132, and a cathode 0133. The first electrode 041 and the anode 0131 are prepared of the same layer and the same material. The functional layer 042 and the light-emitting functional layer 0132 are prepared of the same layer and the same material, the second electrode 043 and the cathode 0133 are prepared of the same layer and the same material. The light source 04 is prepared using the same process as the light-emitting device of the display area. No additional process is required to prepare the light source separately, which simplifies process engineering and saves production costs. Further, in the display surface provided in this embodiment, the light source 04 is located between the first repair layer 03 and the display area 01. At this time, the light source may be encapsulated together with the display area, and for the light source being an organic light-emitting diode, it is also not necessary to use a separate process to encapsulate and protect the light source.

With continued reference to FIG. 7, the display panel further includes a starter 08, the starter 08 is electrically connected to the first electrode 041. The starter 08 is used to provide a potential to the first electrode 041, to start the organic light-emitting diode 04 to emit light, provide light to the first repair layer 03 and repair micro-cracks of the display panel. In an embodiment, the starter 08 includes a metal initiator, and the metal starter is disposed in a same layer as at least one metal layer in the pixel array.

In an embodiment, the light source is a Micro-LED, and the light source is located on a side of the base substrate facing the pixel array or on a side of the base substrate facing away from the pixel array.

Figure 8:
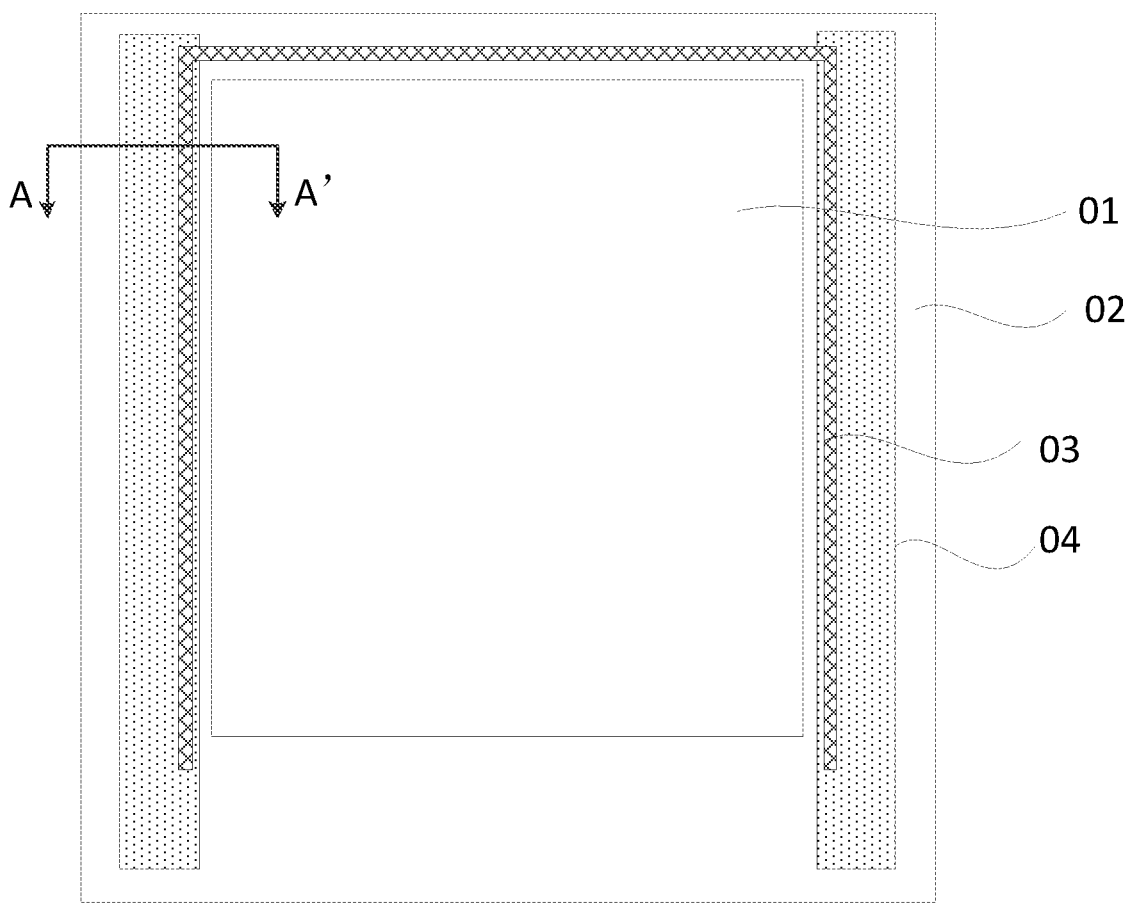
FIG. 8 is a schematic diagram of another implementation mode of a display panel according to an embodiment of the present disclosure.
Figure 9:
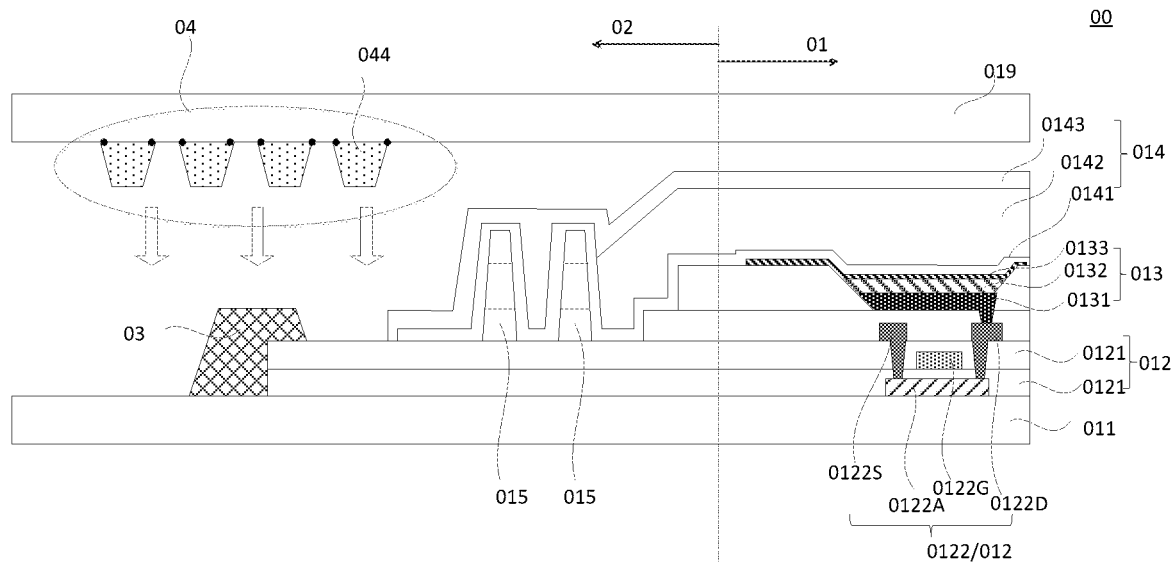
FIG. 9 is a schematic cross-sectional view of the display panel shown in FIG. 8 at AA'.

FIG. 8 is a schematic diagram of another implementation mode of a display panel according to an embodiment of the present disclosure. FIG. 9 is a schematic cross-sectional view of the display panel shown in FIG. 8 at AA'. As shown in FIG. 8 and FIG. 9, the display panel 00 includes a display area 01 and a non-display area 02 surrounding the display area 01. The display panel 00 further includes a first repair layer 03. The first repair layer is located in the non-display area 02. A first repair layer 03 is located on a side of the inorganic insulating layer 0121 facing away from the substrate 011, and the first repair layer 03 covers an edge of the inorganic insulating layer 0121. The light source 04 is located in the non-display area 02, the light source 04 is used to provide light to the first repair layer 03 to trigger a repair function, the light source 04 can directly provide light to the first repair layer 03, the light source 04 includes at least one micro light-emitting diode 044 (micro-LED), and the light source 04 is located on a side of the substrate facing the pixel array 012. The display panel further includes a second substrate 019, the second substrate 019 is on a side of the organic light-emitting layer 013 facing away from the substrate, and the Micro-LED is located on a side of the second substrate 019 facing the substrate 011. Compared with the previous embodiment, the Micro-LED044 in this embodiment is easy to be encapsulated and has lower requirements for encapsulation. Therefore, using the Micro-LED044 as the light source 04 in the non-display area 02 can normally provide light for the first repair layer 03 and reduce the encapsulation difficulty of the light source 04, and the manufacturing difficulty of the display panel can be reduced. In an embodiment, in a direction perpendicular to a plane where the substrate 011 is located, the light source 04 and the first repair layer 03 at least partially overlap. Referring to FIG. 9, the Micro-LED044 may directly provide light to the first repair layer 03 in a direction perpendicular to the substrate 011. The light received by the first repair layer has high efficiency and power is saved.

In an embodiment, the light source is an ultraviolet light source. The light emitted by the ultraviolet light source has a short wavelength, high frequency, and high energy. Under same light intensity, the initiator in the first repair layer 03 under the ultraviolet light source generates the chemical reaction more sufficiently. At the same time, the ultraviolet light source will not affect the normal display of the display area of the display panel, and no light-shielding layer is required to prevent light leakage.

In an embodiment, the display panel further includes an organic light-emitting layer, and the organic light-emitting layer is located on a side of the pixel array facing away from the substrate; the display panel further includes a encapsulation structure, the encapsulation structure is located on a side of the organic light-emitting layer facing away from the substrate, and the encapsulation structure includes at least an organic encapsulation layer and at least one inorganic encapsulation layer; the display panel further includes a second repair layer, the second repair layer has a repair function; and the second repair layer is reused as an organic encapsulation layer.

With continued reference to FIG. 2, the display panel 00 further includes an organic light-emitting layer 013, which is located on a side of the pixel array 012 facing away from the substrate 011; the display panel 00 further includes an encapsulation structure 014, which is located on a side of the organic light-emitting layer 013 facing away from the substrate 011, the encapsulation structure 014 includes at least one organic encapsulation layer and at least one inorganic encapsulation layer; FIG. 2 shows that the encapsulation structure 014 includes a first inorganic encapsulation layer 0141, an organic encapsulation layer 0142, and a second inorganic encapsulation layer 014. The display panel further includes a second repair layer, and the second repair layer has a repair function; the second repair layer is reused as an organic packaging layer 0142. It can be understood that the neutral plane of the display panel is generally located in the pixel array, which is used to protect various traces in the pixel array. The encapsulation structure is far from the neutral plane of the display panel, and the stress received is large when the display panel is bent, the probability of micro-cracks and cracks in the film layer in the encapsulation structure is higher. In the embodiment, the encapsulation layer structure of the display panel includes a second repair layer to repair the encapsulation structure and improve the life of the display panel; at the same time, the second repair layer is reused as an organic encapsulation layer 0142, and the second repair layer is an organic polymer material, which can replace the organic encapsulation layer 0142, and realizes the encapsulation function without affecting the repair function of the encapsulation structure.

In an embodiment, the display panel further includes a thin film touch layer, the thin film touch layer is located on a side of the pixel array facing away from the substrate, the thin film touch layer includes a touch metal layer and an insulating touch layer; the display panel further includes a third repair layer, the third repair layer has a repair function; and the third repair layer is reused as an insulating touch layer.

Figure 10:
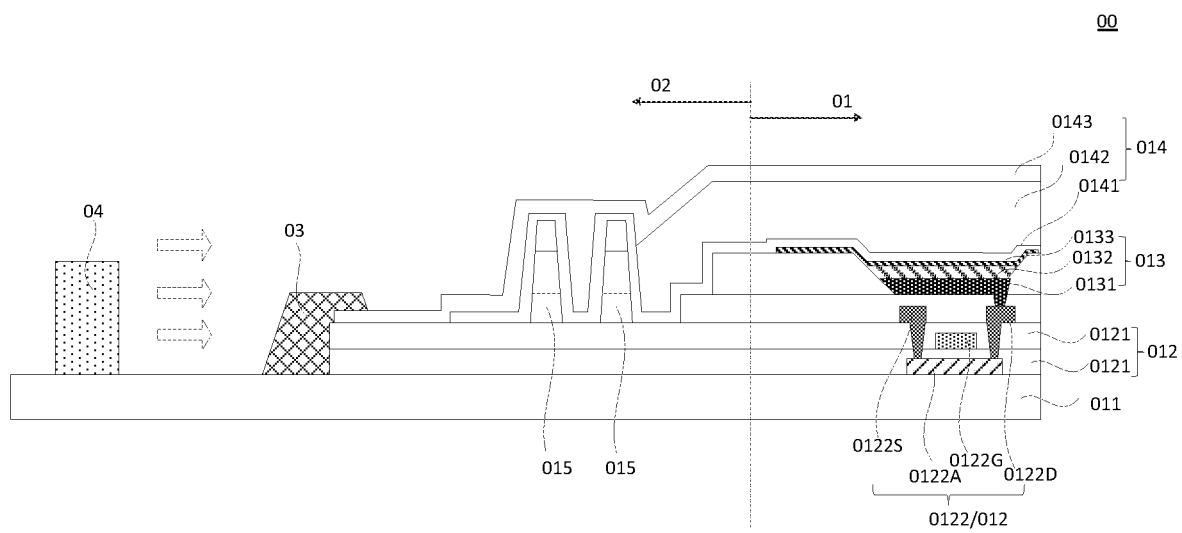
FIG. 10 is a schematic diagram of another embodiment of the display panel shown in FIG. 1 at AA'.

FIG. 10 is a schematic cross-sectional view of the display panel shown in FIG. 2 at AA'. In an embodiment, as shown in FIG. 10, the first repair layer 03 covers the edge of the second inorganic encapsulation layer 0142 of the encapsulation structure 014, the second inorganic encapsulation layer 0142 is the outermost encapsulation structure, and the first repair layer 03 covers the edge of the second inorganic packaging layer 0142 to repair the encapsulation structure and achieve self-healing of the display panel.

In an embodiment, the non-display area includes a bending area and a binding area, and the binding area is located on a side of the bending area facing away from the display area; the bending area includes a fourth repair layer, the fourth repair layer has the repair function, and the fourth repair layer is used to repair the bending area.

Figure 11:
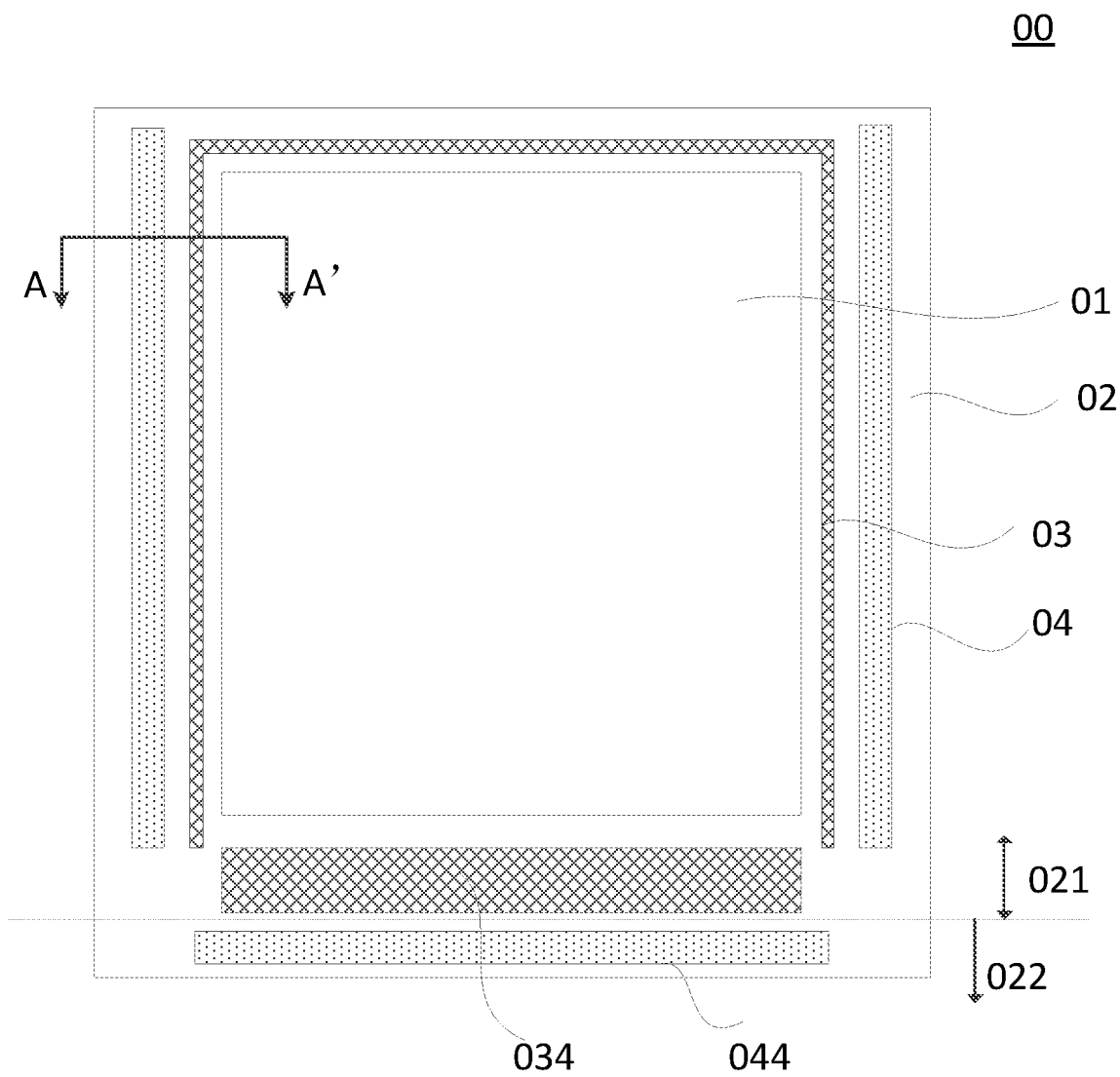
FIG. 11 is a schematic diagram of an implementation mode of a display panel according to an embodiment of the present disclosure.

FIG. 11 is a schematic diagram of an implementation mode of a display panel according to an embodiment of the present disclosure. As shown in FIG. 11, the non-display area 02 includes a bending area 021 and a binding area 022, and the binding area 022 is located on a side of the bending area 021 facing away from the display area 01; the bending area 021 includes a fourth repair layer 034, the fourth repair layer 034 has the repair function, and the fourth repair layer 034 is used to repair the bending area 021. A fourth light source 044 provides light for the first repair layer 034 to trigger the fourth repair layer to repair the display panel. Since the bending area 021 needs to be designed for bending and the display panel film layer is prone to break or crack during the bending process, the fourth repair layer 034 is located in the bending area, in one embodiment, the fourth repair layer 034 performs crack repair on the bending area of the display panel; in another embodiment, the first repair layer as an organic polymer material can be used as a protective film to increase the bending performance of the bending area 021.

In an embodiment, when the display panel is a flexible display panel, the display panel has a bendable area, and a repair layer is fixedly positioned on the bendable area to increase the life of the display panel.

Figure 12:
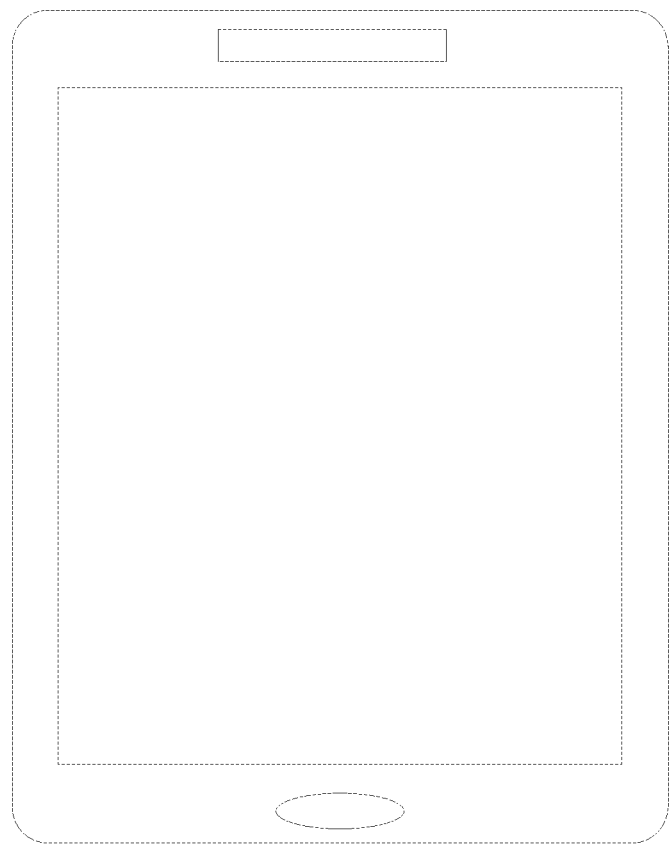
FIG. 12 is a schematic diagram of a display device according to an embodiment of the present disclosure.

The present disclosure also provides a display device. FIG. 12 is a schematic diagram of a display device according to an embodiment of the present disclosure. As shown in FIG. 12, the display device includes the display panel provided by any embodiment of the present disclosure. The display panel provided by the present disclosure includes but is not limited to the following categories: television, notebook computer, desktop display, tablet computer, digital camera, mobile phone, smart bracelet, smart glasses, car display, medical equipment, industrial control equipment, touch interaction terminal, etc.

It can be known from the above embodiments that the display panel and the display device provided by the present disclosure achieve at least the following beneficial effects.

The display panel provided by the present disclosure includes a display area and a non-display area surrounding the display area; a substrate and a pixel array, where the pixel array is located on a side of the substrate, the pixel array includes at least one inorganic insulating layer and an edge of the inorganic insulating layer is located in the non-display area; a first repair layer, where the first repair layer is located in the non-display area, the first repair layer is located on a side of the inorganic insulating layer facing away from the substrate, the first repair layer covers the edge of the inorganic insulating layer, the first repair layer is in contact with the substrate, and the first repair layer has a repair function. When the display panel is accidentally dropped, accidentally collided, mechanically stretched, and mechanically folded, the film layer in the display panel is prone to stress and cracks, and especially at the edge of the inorganic layer of the display panel, due to the poor flexibility and hardness of the inorganic layer, the risk of film peeling is higher, and cracks are more likely to occur. In one embodiment, a first repair layer is provided on the edge of the inorganic layer, and the first repair layer has a repair function. When a crack occurs on the edge of the inorganic insulating layer of the display panel, the first repair layer can quickly fill the crack gaps, which avoid the situation that the expansion of the cracks to the display area to cause display poorly of the display panel and requiring the replacement of components, and the service life of the display panel is improved; in another embodiment, the first repair material is more viscous than the inorganic insulating layer, the first inorganic layer after filling the crack gap can better fix the inorganic insulating layer, increase the adhesion between the inorganic insulating layers, and the inorganic insulating layers are better bonded, so the probability of new cracks becomes smaller and the stability of the display panel is improved. Further, the display panel provided by the present disclosure further includes a light source. The light source is located in the non-display area and is used to provide light to the first repair layer to induce repair function. The light source provides light to the first repair layer and is used to autonomously trigger the activation of the first repair layer to carry out the repair process of cracks. Compared with the related art, in one embodiment, the light provided by the present disclosure actively initiates the repair process of the first repair layer, which does not require external stimulation or heating system to initiate the repair process, and reduces the impact of external stimulation and heating systems on the display panel; in another embodiment, the repair process of the display panel can be started at any time by adjusting the lighting time of the light source, and the defects of the display panel can be repaired at any time, which extends the life of the display panel.

What is claimed is:

1. A display panel, comprising:
   a display area and a non-display area surrounding the display area;
   a substrate;
   a pixel array, wherein the pixel array is located at a side of the substrate, the pixel array comprises at least one inorganic insulating layer, and an edge of the inorganic insulating layer is located in the non-display area;
   a first repair layer, wherein the first repair layer is located in the non-display area, the first repair layer is located on a side of the inorganic insulating layer facing away from the substrate, the first repair layer covers the edge of the inorganic insulating layer, the first repair layer is in contact with the substrate, and the first repair layer has a repair function; and
   a light source, wherein the light source is located in the non-display area and configured to provide light to the first repair layer to trigger the repair function.

2. The display panel of claim 1, wherein the first repair layer comprises a base material and an initiator.

3. The display panel of claim 2, wherein the initiator comprises a photoacid generator, and the base material comprises an acrylic monomer.

4. The display panel of claim 1, wherein the light source is selective light-emitting.

5. The display panel of claim 4, wherein the light source is active and selective light-emitting, and a light-emitting frequency of the light source is a fixed frequency.

6. The display panel of claim 4, wherein the light source is passive and selective light-emitting, and the light source is configured to emit light after the display panel is subject to an external stimuli.

7. The display panel of claim 1, wherein the inorganic insulating layer has at least one groove, and the groove is located in the non-display area; and the groove is filled with the first repair layer.

8. The display panel of claim 1, wherein the display panel further comprises:
   a light-shielding layer, the light-shielding layer is located on a side of the pixel array facing away from the substrate, and the light-shielding layer is located in the non-display area.

9. The display panel of claim 1, wherein the display panel further comprises:
   an organic light-emitting layer, the organic light-emitting layer is located on a side of the pixel array facing away from the substrate, and the organic light-emitting layer comprises a plurality of light-emitting devices; and
   the light source is an organic light-emitting diode, and the organic light-emitting diode is prepared in a same layer as the plurality of light-emitting devices.

10. The display panel of claim 1, wherein the light source is a Micro-LED, and the light source is located on a side of a base substrate facing the pixel array or on a side of the base substrate facing away from the pixel array.

11. The display panel of claim 10, wherein in a direction perpendicular to a plane where the substrate is located, the light source and the first repair layer at least partially overlap.

12. The display panel of claim 1, wherein the light source is an ultraviolet light source.

13. The display panel of claim 1, wherein the display panel further comprises:
   an organic light-emitting layer, the organic light-emitting layer is located on a side of the pixel array facing away from the substrate; the display panel further comprises an encapsulation structure, the encapsulation structure is located on a side of an organic light-emitting layer facing away from the substrate, and the encapsulation structure comprises at least one organic encapsulation layer and at least one inorganic encapsulation layer;
   the display panel further comprises a second repair layer, and the second repair layer has the repair function; and
   the second repair layer is reused as the organic encapsulation layer.

14. The display panel of claim 1, wherein the display panel further comprises:
   a thin film touch layer, the thin film touch layer is located on a side of the pixel array facing away from the substrate, and the thin film touch layer comprises a touch metal layer and an insulating touch layer;
   the display panel further comprises a third repair layer, and the third repair layer has the repair function; and
   the third repair layer is reused as the insulating touch layer.

15. The display panel of claim 1, wherein the non-display area comprises:
   a bending area and a binding area, and the binding area is located on a side of the bending area facing away from the display area; and
   the bending area comprises a fourth repair layer, the fourth repair layer has the repair function, and the fourth repair layer is used to repair the bending area.

16. A display device, comprising:
   a display panel, wherein the display panel comprises:
   a display area and a non-display area surrounding the display area;
   a substrate;
   a pixel array, wherein the pixel array is located at a side of the substrate, the pixel array comprises at least one inorganic insulating layer, and an edge of the inorganic insulating layer is located in the non-display area;
   a first repair layer, wherein the first repair layer is located in the non-display area, the first repair layer is located on a side of the inorganic insulating layer facing away from the substrate,
   the first repair layer covers the edge of the inorganic insulating layer, the first repair layer is in contact with the substrate, and the first repair layer has a repair function; and
   a light source, wherein the light source is located in the non-display area and configured to provide light to the first repair layer to trigger the repair function.

* * * * *